United States Patent [19]

Chau et al.

[11] Patent Number: 5,710,450
[45] Date of Patent: Jan. 20, 1998

[54] TRANSISTOR WITH ULTRA SHALLOW TIP AND METHOD OF FABRICATION

[75] Inventors: Robert S. Chau, Beaverton; Chan-Hong Chern, Portland; Chia-Hong Jan, Portland; Kevin R. Weldon, Portland; Paul A. Packan, Beaverton; Leopoldo D. Yau, Portland, all of Oreg.

[73] Assignee: Intel Corporation, Santa Clara, Calif.

[21] Appl. No.: 363,749

[22] Filed: Dec. 23, 1994

[51] Int. Cl.⁶ .......................... H01L 29/06; H01L 21/265
[52] U.S. Cl. .......................... 257/344; 257/19; 257/65;
257/336; 257/377; 257/382; 257/385; 257/408;
257/742; 257/755; 257/773; 437/41; 437/43;
437/90; 437/101; 437/162; 437/189; 437/191;
437/192; 437/203; 437/228; 437/233; 437/913
[58] Field of Search .......................... 257/19, 65, 382,
257/742, 755, 377, 385, 773, 336, 344,
408; 437/41, 43, 90, 101, 162, 189, 191,
192, 203, 228, 233, 913

[56] References Cited

U.S. PATENT DOCUMENTS

| | | | |
|---|---|---|---|
| 4,998,150 | 3/1991 | Rodder et al. | 257/288 |
| 5,079,180 | 1/1992 | Rodder et al. | |
| 5,168,072 | 12/1992 | Moslehi | 437/41 |
| 5,285,088 | 2/1994 | Sato et al. | 257/19 |
| 5,336,903 | 8/1994 | Ozturk et al. | 257/19 |
| 5,397,909 | 3/1995 | Moslehi | 257/383 |
| 5,405,795 | 4/1995 | Beyer et al. | 437/41 |

OTHER PUBLICATIONS

Pfiester, J.R., et al., Reverse Elevated Source/Drain (RESD) MOSFET for Deep Submicron CMOS, *IEDM92*, (1992) pp. 885–888., Jan.

Wong, S.S., et al., Elevated Source/Drain MOSFET, *IEDM84*, (1984) pp. 634–637., Jan.

Wu, Kevin et al., Fabrication and Characterization of the Hot-Carrier Suppressed (HCS) MOSFET, *SRC TechCon '93*, p. 539., Jan.

Yau, L.D., A Simple Theory to Predict the Threshold Voltage of Short-Channel IGFETS, *Solid State Electronics*, (1971) pp. 1059–1062., Jan.

*Primary Examiner*—Edward Wojciechowicz
*Attorney, Agent, or Firm*—Blakely, Sokoloff, Taylor & Zafman

[57] ABSTRACT

A novel transistor with a low resistance ultra shallow tip region and its method of fabrication. The novel transistor of the present invention has a source/drain extension or tip region comprising an ultra shallow region which extends beneath the gate electrode and a raised region.

30 Claims, 7 Drawing Sheets

TRANSISTOR WITH ULTRA SHALLOW TIP AND METHOD OF FABRICATION

BACKGROUND OF THE INVENTION

1. Field of the Invention

The present invention relates to the field of semiconductor integrated circuits, and more specifically, to the ultra large-scale fabrication of submicron transistors.

2. Discussion of Related Art

Today literally millions of individual transistors are coupled together to form very large-scale integrated (VLSI) circuits, such as microprocessors, memories, and applications specific integrated circuits (ICs). Presently, the most advanced ICs are made up of approximately three million transistors, such as metal oxide semiconductor (MOS) field effect transistors having gate lengths on the order of 0.5 μm. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 μm. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques. Formed adjacent to opposite sides of gate electrode 102 and over tip regions 110 are a pair of sidewall spacers 108. A pair of source/drain regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punchthrough characteristics of the fabricated transistor. Unfortunately, the length of tip region 110, however, must be larger than 0.10 μm to insure that the later, heavy dose, deep source/drain implant does not swamp and overwhelm tip region 110. Thus, in the fabrication of a small scale transistor with conventional methods, as shown in FIG. 1, the tip region 110 is both shallow and long. Because tip region 110 is both shallow and long, tip region 110 exhibits substantial parasitic resistance. Parasitic resistance adversely effects (reduces) the transistors drive current.

Thus, what is needed is a novel transistor with a low resistance ultra shallow tip region with a VLSI manufacturable method of fabrication.

SUMMARY OF THE INVENTION

A novel transistor with a low resistance ultra shallow tip region and its method of fabrication is described. According to the preferred method of the present invention, a gate dielectric layer is formed on a first surface of a semiconductor substrate. Next, a gate electrode is formed on the gate dielectric layer. Then a first pair of sidewall spacers are formed adjacent to opposite sides of the gate electrode. Next, a pair of recesses are formed in the semiconductor substrate in alignment with the outside edges of the first pair of sidewall spacers. Next, a semiconductor material is selectively deposited into the recesses such that the semiconductor material extends both above and below the first surface of the semiconductor substrate. Dopants are then diffused from the semiconductor material into the substrate beneath the first pair of sidewall spacers to form an ultra shallow tip region. A second pair of sidewall spacers are then formed on semiconductor material adjacent to the outside edges of the first pair of sidewall spacers. Next, a deep implant is made in alignment with the outside edges of the second pair of sidewall spacers to form a deep junction source/drain contact region. Finally, silicide is formed onto the source/drain regions and gate electrode of the fabricated transistor.

BRIEF DESCRIPTION OF THE DRAWINGS

FIG. 3b is an illustration of a cross-sectional view showing the formation of recess regions in the substrate of FIG. 3a.

DETAILED DESCRIPTION OF THE PRESENT INVENTION

A novel transistor with a low resistance ultra shallow tip and its method of fabrication is described. In the following description numerous specific details are set forth, such as specific materials, dimensions, and processes, etc., in order to provide a thorough understanding of the present invention. It will be obvious, however, to one skilled in the art, that the invention may be practiced without these specific details. In other instances, well-known semiconductor equipment and processes have not been described in particular detail in order to avoid unnecessarily obscuring the present invention.

Figure 1:
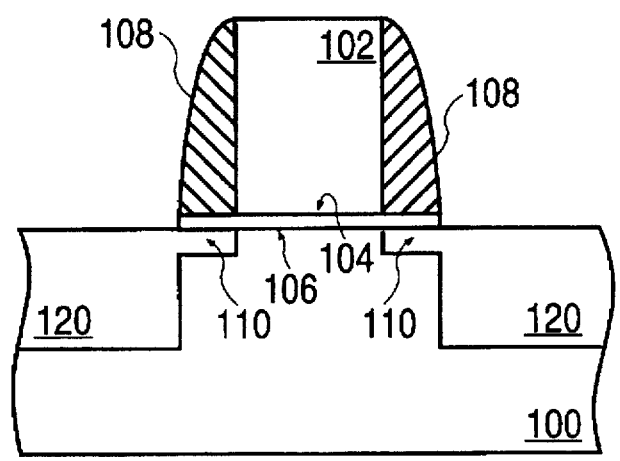
FIG. 1 is an illustration of a cross-sectional view of a con transistor.
Figure 2:
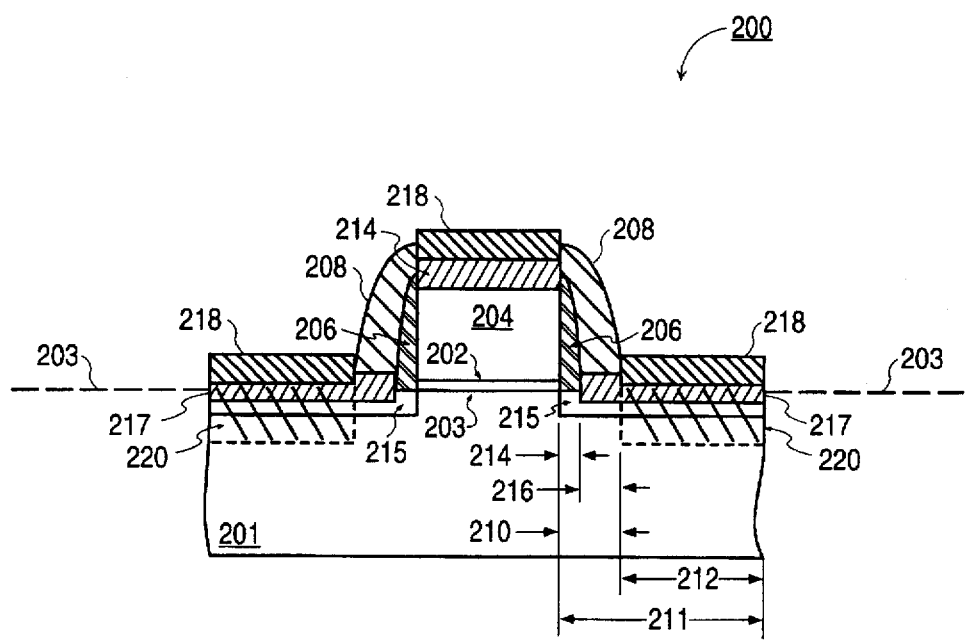
FIG. 2 is an illustration of a cross-sectional view of a low resistance ultra shallow tip transistor of the present invention.

A preferred embodiment of a novel transistor 200 with low resistivity, ultra shallow tip of the present invention is shown in FIG. 2. Transistor 200 is formed on a silicon substrate or well 201. A gate dielectric layer 202 is formed on a surface 203 of substrate 201 and a gate electrode 204 is in turn formed on gate dielectric layer 202. A first pair of thin sidewall spacers 206 are formed on opposite sides of gate electrode 204 (spacers 206 run along the "width" of gate electrode 204). Transistor 200 also includes a second pair of substantially larger sidewall spacers 208 formed adjacent to the outside edges of the first pair of sidewall spacers 206. Transistor 200 includes a pair of source/drain regions 211 each comprising a pair of tips or source/drain extensions 210 and a source/drain contact region 212.

Tip or source/drain extension 210 is defined as the source/drain region located beneath second sidewall spacer 208, first sidewall spacer 206, and the outside edge of gate electrode 204. Tip 210 comprises an ultra shallow tip portion 214 and a raised tip portion 216. Ultra shallow tip portion 214 is comprised of a doped semiconductor substrate 215 formed by "out diffusing" dopants from selectively deposited semiconductor material 217 into substrate 201. Ultra shallow tip 214 extends from beneath first sidewall spacer 206 to the outside edges of gate electrode 204. Ultra shallow tip 214 preferably extends approximately 100 Å, beneath gate electrode 204 for a transistor with an effective gate length of approximately 0.10 microns (or 1000 Å). Additionally, ultra shallow tip 214 preferably extends less than 500 Å deep into substrate 201 beneath substrate surface 203 for a 0.10 µm effective gate length. It is to be appreciated that because a novel method of fabrication is employed in the present invention, ultra shallow tip 214 is characterized by a very abrupt junction.

Tip 210 of transistor 200 also includes a raised tip portion 216. Raised tip portion 216 is located beneath second sidewall spacer 208 and is adjacent to the outside edges of first sidewall spacer 206. Raised tip 216 is preferably formed of doped semiconductor material 217 selectively deposited both above and below surface 203 of semiconductor substrate 215. Because a portion of raised tip 216 is formed above semiconductor substrate surface 203, raised tip 216 is said to be "raised". A raised tip significantly reduces the parasitic resistance of transistor 200 and thereby improves its performance.

A pair of source/drain contact regions 212 are formed adjacent to the outside edge of second sidewall spacer 208. Source/drain contact regions 212 are deep junction source/drain contacts. Source/drain contact regions 212 are formed by ion implantation or diffusing additional dopants into a region 220 comprising selectively deposited semiconductor material 217, "out diffused" doped semiconductor substrate 215 and substrate 201 in alignment with the outside edges of second sidewall spacers 208. Source/drain contact regions 212 are partially raised source/drain regions. Silicide 218 is preferably formed on source/drain region 212 in order to reduce the contact resistance of transistor 200. Additionally, according to the present invention, first semiconductor material 217 is preferably deposited onto the top surface of gate electrode 204. Silicide 218 is also preferably formed on deposited semiconductor material 217 on gate electrode 204 to help improve contact resistance.

It is to be appreciated that a valuable feature of the present invention is the fact that transistor 200 includes a tip or source/drain extension 210 which is both ultra shallow and raised. In this way, transistor 200 has a shallow tip with a very low parasitic resistance. The novel structure of transistor 200 allows for tip scaling necessary for the fabrication of transistor 200 with effective gate length less than 0.15 µm. Because of the novel tip structure 210 of the present invention, transistor 200 has good punchthrough performance and reduced $V_T$ roll-off. Additionally, because of tip 210, transistor 200 has a low parasitic resistance, resulting in good drive current.

Figure 3A:
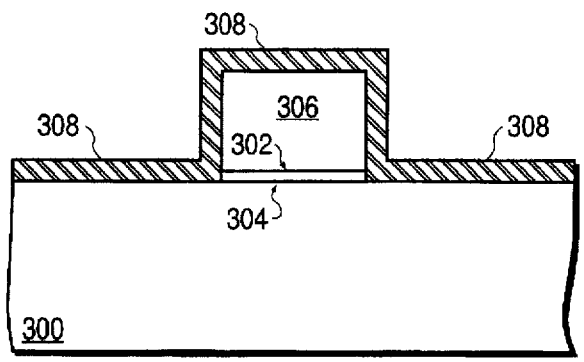
FIG. 3a is an illustration of a cross-sectional view showing the formation of a first pair of sidewall spacers on opposite sides of a gate electrode formed on a substrate.

FIGS. 3a–3f illustrate a presently preferred method of fabrication of a transistor with a low resistance ultra shallow tip region. The preferred method of fabrication will be described with respect to the fabrication of a PMOS transistor. It is to be appreciated that the preferred method is equally applicable to the fabrication of NMOS devices wherein the conductivity types are simply reversed. As shown in FIG. 3a, a PMOS transistor of the present invention is preferably fabricated on an n-type substrate or well 300 doped to a concentration level between $1 \times 10^{17}/cm^3$ to $1 \times 10^{19}/cm^3$. It is to be appreciated that substrate 300 may additionally include a top layer or layers of deposited semiconductor material. According to the present invention, a substrate is defined as the starting material on which the transistor is fabricated.

According to the present invention, first a gate dielectric layer 302 is formed on top surface 304 of substrate 300. Gate dielectric layer 302 is preferably a nitrided-oxide layer formed to a thickness of between 20 Å–50 Å. It is to be appreciated that other well-known gate dielectric layers, such as oxides, nitrides, and combinations thereof, may be utilized, if desired. Next, a gate electrode 306 is formed over gate dielectric layer 302. Gate electrode 306 is preferably formed from a 1000–3500 Å blanket deposited polysilicon layer patterned into gate electrode 306 with well-known photolithographic techniques. It is to be appreciated that other well-known patterning techniques may be utilized to pattern gate electrode 306, including submicron photolithography techniques and subphotolithographic patterning techniques such as described in copending patent application entitled "Inverted Spacer Transistor", Ser. No. 08/288,332 filed Aug. 10, 1994, and assigned to the present assignee. Additionally, although gate electrode 306 is preferably a polysilicon gate electrode, gate electrode 306 can be a metal gate, a single crystalline silicon gate, or any combination thereof, if desired.

Next, as also shown in FIG. 3a, a first sidewall spacer layer 308 is blanket deposited over substrate 300 and the top and sides of gate electrode 306. Spacer layer 308 is preferably a silicon dioxide layer deposited by any well-known process, to a thickness of between approximately 50 Å–500 Å with 200 Å, being preferred. It is to be appreciated that other insulators, such as silicon-nitride and nitride-oxides, etc., may be utilized as spacer layer 308, if desired. It is to be appreciated that spacer layer 308 must be formed thick enough to electrically isolate a subsequently deposited semiconductor material from gate electrode 306. Additionally, as will be appreciated later, the thickness of sidewall spacer layer 308 defines the resulting spacer thickness and the minimum length of the ultra shallow tip portion of the fabricated transistor.

Figure 3B:
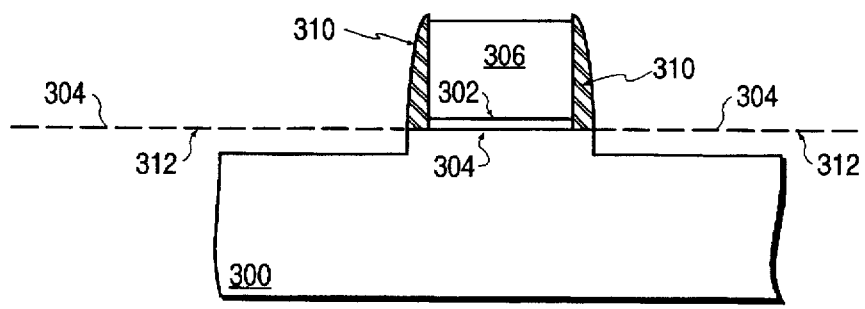

Next, as shown in FIG. 3b, first sidewall spacer layer 308 is anisotropically dry etched with any well-known technique to form a first pair of sidewall spacers 310 which run along the width of gate electrode 306.

Next, as shown in FIG. 3b, substrate 300 is anisotropically etched with any well-known technique, such as reactive ion etching (RIE) with a chemistry comprising $C_2F_6$ and He at a ratio of 2:1, respectively, to form a pair of recesses 312 in silicon substrate 300 in alignment with the outside edges of first sidewall spacers 310. It is to be noted that polysilicon gate electrode 306 is partially etching during the silicon substrate recess etch. Gate electrode 306 and first sidewall spacer 310 act as a mask preventing silicon substrate surface 304, located underneath, from being etched. In this way the recess etch of the present invention is self-aligned to the outside edges of first sidewall spacers 310. According to the preferred embodiment of the present invention, substrate 300 is etched to form recess regions 312 with depths of between approximately 20 Å–1000 Å, with a depth of 200 Å below substrate surface 304 being preferred. It is to be appreciated that the depth of recess region 312 defines a minimum depth at which the fabricated transistors' ultra shallow tips will extend into substrate 300. The deeper the recess regions, the deeper the transistor tip regions will extend into substrate 300.

Figure 3C:
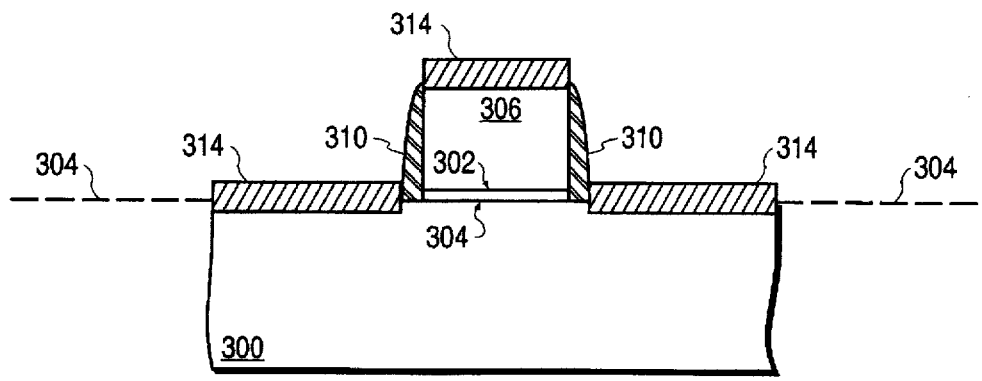
FIG. 3c is an illustration of a cross-sectional view showing the deposition of semiconductor material on the substrate of FIG. 3b.

Next, according to the preferred embodiment of the present invention, as shown in FIG. 3c, semiconductor material 314 is selectively deposited into recesses 312 and onto the top surface of gate electrode 306. Semiconductor material 314 is selectively deposited so that it forms only on exposed silicon such as substrate 300 and polysilicon gate electrode 306. No semiconductor material is formed on sidewall spacer 310. Sidewall spacers 310 electrically isolate semiconductor material 314, formed in recesses 312, from gate electrode 306. Semiconductor material 314 is formed to a thicknesses of between 200 Å–2000 Å, with approximately 600 Å being preferred. In this way semiconductor material 314 is formed both above and below surface 304 of semiconductor substrate 300. Additionally, semiconductor material 314 is preferably in-situ doped with p-type impurities, such as boron, to a concentration level between $1\times10^{18}/cm^3$ to $5\times10^{20}/cm^3$, with a concentration of approximately $1\times10^{20}/cm^3$ being preferred. Additionally, it is to be appreciated that semiconductor material need not be in-situ doped, but rather may be doped to the desired conductivity level after deposition by ion implantation or diffusion. For example, in the fabrication of CMOS or BiCMOS parts it may be necessary to dope semiconductor material 314 after deposition so that standard photoresist masking techniques can be used to form both p-type conductivity semiconductor material and n-type conductivity semiconductor material for the PMOS and NMOS devices, respectively, of a CMOS circuit.

It is to be noted that the thickness and doping concentration level of semiconductor material 314 determines the resistivity of the raised tip portion of the fabricated transistor. A thicker and higher doped semiconductor material 314 results in a transistor with a lower parasitic resistance. An adverse capacitance (i.e., Miller capacitance), however, can be developed when opposite voltages are placed on gate electrode 306 and semiconductor material 314. The higher the doping and the thicker semiconductor material 314 is, the greater is the Miller capacitance. Thus, a trade off must be made between the transistors' parasitic resistance and its Miller capacitance.

According to the present invention, semiconductor material 314 is preferably a silicon/germanium semiconductor alloy with germanium comprising approximately 10–50% of the alloy. A silicon/germanium semiconductor alloy can be formed by decomposition of $SiH_2Cl_2$ and $GeH_4$ in $H_2$ ambient, at a temperature of between 500°–800° C., with 600° C. being preferred. Such a semiconductor material is preferred because it exhibits good selectivity to silicon during deposition, making the present invention very manufacturable. Additionally, such a silicon/germanium semiconductor alloy exhibits many "faults" or "dislocations" which aid in the solid state diffusion of dopants through the semiconductor material. It is to be appreciated any semiconductor material which can be selectively deposited can be used to form semiconductor material 314. For example, semiconductor material 314 can be selectively deposited polycrystalline silicon formed from $SiH_2Cl_2$ and HCl in a $H_2$ ambient, at temperature of between 600°–900° C., or can be selectively deposited single crystalline silicon formed by any well-known technique.

Figure 3D:
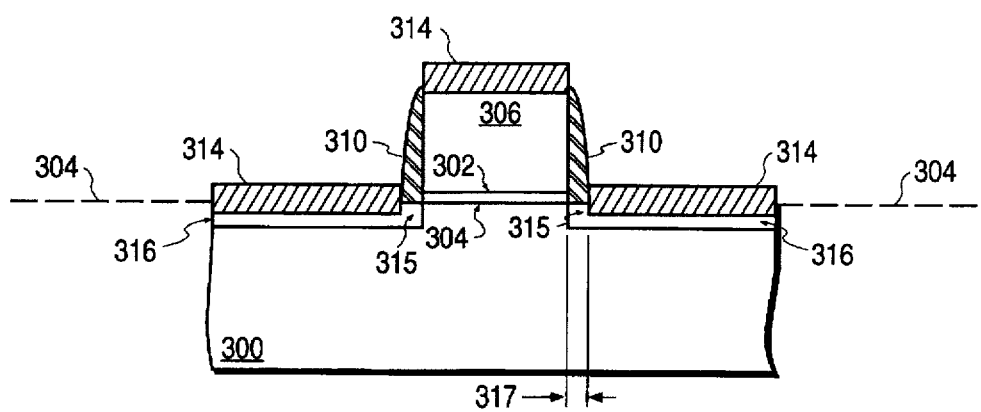
FIG. 3d is an illustration of a cross-sectional view showing the solid-state diffusion of dopants into the substrate of FIG. 3c.

Next, according to the present invention, as shown in FIG. 3d, p-type impurities or dopants are diffused out from semiconductor material 314 and into semiconductor substrate 300 to form diffused semiconductor regions 316. The out diffusion of impurities forms diffused semiconductor regions 316 with a concentration level approximately equal to the deposited semiconductor material 314. Impurities are diffused laterally (horizontally) beneath first thin sidewall spacers 310 until impurities reach at least the outside edges of gate electrode 306 and preferably extend approximately 100 Å, beneath gate electrode 306. The portion of diffused semiconductor regions 316 which laterally extend beneath first sidewall spacer 310 and gate electrode 306 is the ultra shallow tip portion of the fabricated transistor. It is to be appreciated that the out diffusion of impurities also diffuses impurities deeper (or vertically) into substrate 300. For each 200 Å of lateral diffusion, dopants diffuse about 200 Å vertically into substrate 300. Thus, according to the preferred embodiment of the present invention, ultra shallow tips 317 are approximately 300 Å in length and approximately 500 Å (or 0.05 μm) deep for a 0.10 μm effective gate length.

According to the preferred embodiment of the present invention, solid-state diffusion step occurs directly after the formation of semiconductor material 314 with a rapid thermal process (RTP) at a temperature between 800° C. to 1000° C. for 5 to 60 seconds in a nitrogen ($N_2$) ambient. It is to be appreciated that the solid-state diffusion step of the present invention need not necessarily occur directly after the formation of semiconductor material 314, but rather can occur during later thermal cycles used in subsequent process steps.

It is to be appreciated that a key feature of the present invention is the fact that the semiconductor material 314 is formed beneath semiconductor substrate surface 304. That is, in the present invention, a source of dopants 315 is placed into substrate 300 directly adjacent to the location where the ultra shallow tip 317 is to be formed. In this way during the solid-state diffusion step, dopants are able to easily diffuse in a single direction (laterally) below the first sidewall spacer 310 and underneath the outside edge of polysilicon gate electrode 306. This results in an ultra shallow tip 317, which is characterized by a very sharp and abrupt junction with substrate 300. Such an abrupt junction improves the punch-through characteristics of the fabricated transistor. Additionally, it is to be appreciated that by forming ultra shallow tips 317 by solid-state diffusion, higher conductivity tips can be fabricated than possible with present standard ion implantation techniques. A higher concentration tip region improves the device's performance and lowers the devices parasitic resistance.

Figure 3E:
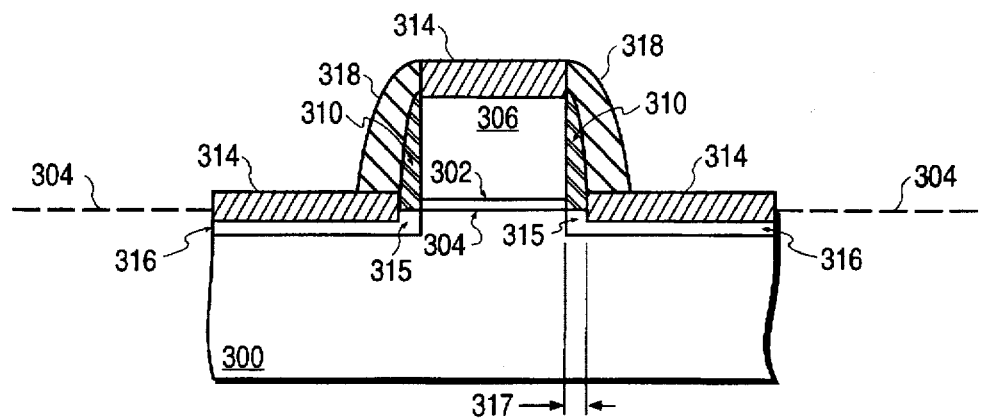
FIG. 3e is an illustration of a cross-sectional view showing the formation of a second pair of sidewall spacers on the substrate of FIG. 3d.

Next, as shown in FIG. 3e, a second pair of sidewall spacers 318 are formed on deposited semiconductor material 314 and adjacent to the outside edges of first sidewall spacer 310. Second sidewall spacer 318 are preferably formed by anisotropically dry etching a conformal layer of silicon nitride formed by a hot wall process. Like sidewall spacers 310, second sidewall spacer 318 can be formed by any one of a variety of well-known techniques, if desired. Second sidewall spacers 318 are substantially thicker than first sidewall spacers 310 and are formed to a thickness of between 500 Å–2500 Å, with 1800 Å being preferred.

Figure 3F:
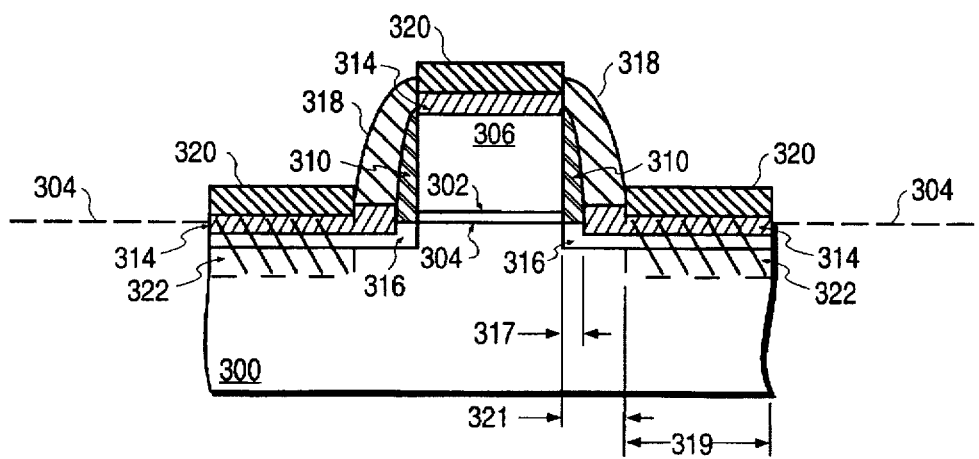
FIG. 3f is an illustration of a cross-sectional view showing the formation of a deep junction source/drain contact regions in the substrate of FIG. 3d.

Next, as shown in FIG. 3f, fabrication of transistor 340 is completed with the formation of source/drain contact regions 319. After formation of second sidewall spacer 318, shown in FIG. 3e, the substrate is subjected to a standard and well-known ion implantation and anneal which implants p-type conductivity impurities, such as boron, into deposited semiconductor material 314, diffused silicon region 316, and semiconductor substrate 300. The ion implantation step preferably forms a source/drain contact region 322 with a p-type conductivity level of between $1\times10^{19}/cm^3$ to $5\times10^{20}/cm^3$, and a source/drain contact region 319 having a total thickness of between 0.15–0.25 μm. Additionally, the ion implantation step can also be used to dope polysilicon gate electrode 306, if not previously doped during polysilicon gate electrode 306 formation. It is to be appreciated that the second sidewall spacers 318 must be formed thick and wide enough to provide a sufficient mask to prevent the deep, high dose, ion implantation of the source/drain contact regions 319 from overwhelming the fabricated tip region 321.

Next, according to the preferred method of the present invention, silicide 320 is formed by a self-aligned silicide process (salicide) onto deposited semiconductor material 314 on source/drain contact regions 319 and onto deposited semiconductor material 314 formed on gate electrode 306 to significantly reduce the devices contact resistance. In the preferred salicide process a titanium layer is first blanket deposited over the entire device. The device is then temperature cycled to cause a reaction between the deposited titanium layer and any exposed silicon surfaces (i.e., semiconductor material 314 on gate electrode 306 and semiconductor material 314 on source/drain contact region 319) to form titanium silicide 320 (i.e., $TiSi_x$). It is to be appreciated that titanium does not react with second sidewall spacer 318. Next, a selective etch is used to remove the unreacted titanium from second sidewall spacers 318 and leave titanium silicide 320. It is to be appreciated that other refractory metals, such as tungsten, can be used to form silicide 320. Additionally, it is to be noted that second sidewall spacers 318 must be formed thick enough to prevent silicide encroachment from electrically shorting the gate electrode to the source/drain contact regions. After completion of the silicide process, the preferred method of fabrication of a novel transistor 340 with a low resistance ultra shallow tip region is complete.

Figure 4:
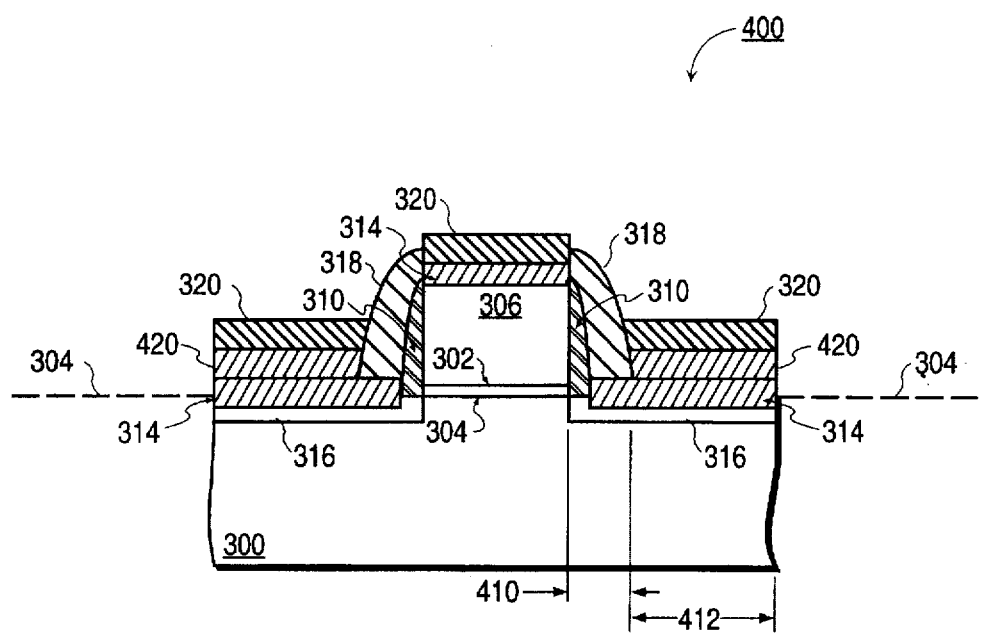
FIG. 4 is an illustration of a cross-sectional view showing another preferred embodiment of the low resistance ultra shallow tip transistor of the present invention with shallow junction deposited semiconductor source/drain contact regions.

FIG. 4 is a cross-sectional view of a preferred alternative embodiment of the present invention. FIG. 4 is a MOS transistor 400 with a low resistance ultra shallow tip 410 and a pair of partially raised shallow junction source/drain contact regions 412. Transistor 400 is fabricated in the same manner as transistor 340 as illustrated and described in FIGS. 3a–3e and accompanying specification, respectively. After the formation of sidewall spacers 318, a second selective deposition of semiconductor material is used to form second semiconductor material 420 onto the top surface of first deposited semiconductor material 314 adjacent to the outside edges of second sidewall spacers 318 and on semiconductor material 314 formed on gate electrode 306. Second semiconductor material 420 is formed thick enough, between 100 Å to 1500 Å, and to a concentration level sufficient, between $1\times10^{19}/cm^3$ to $5\times10^{20}/cm^3$, to provide an adequate source/drain contact region 412 for the fabricated device. It is to be appreciated that the resulting source/drain contact region 412 must be thick enough to provide adequate insurance against metal contact spiking. Second semiconductor material 420 is preferably formed of a silicon/germanium alloy doped with a p-type impurity, such as boron, to the desired conductivity level. It is to be appreciated that second sidewall spacer 318 needs to be formed thick enough to prevent excessive Miller capacitance from developing between second semiconductor material 420 and gate electrode 306 and thereby adversely effecting device performance.

A chemical-mechanical polishing process is preferably used at this time to remove second semiconductor material 420 from the top surface of gate electrode 306 in order to improve the topography of the fabricated transistor. Finally, a self-aligned-silicide (salicide) process is used to form silicide 320, onto second deposited semiconductor material 420 and on top of semiconductor material 314 on top of gate electrode 306.

Figure 5:
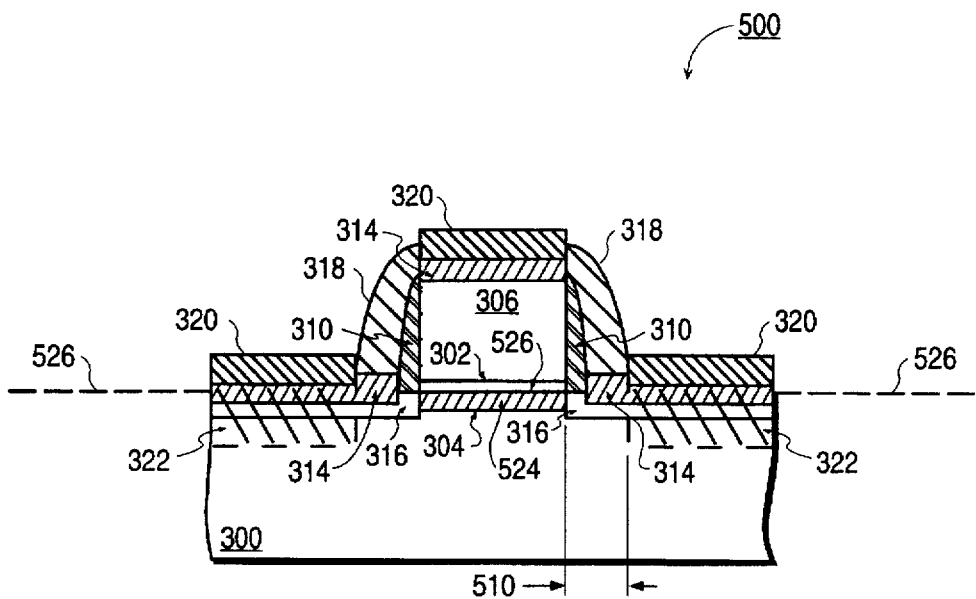
FIG. 5 is an illustration of a cross-sectional view showing another preferred embodiment of the low resistance ultra shallow tip transistor of the present invention with a deposited semiconductor buried channel region.

FIG. 5 is a cross-sectional view of a preferred alternative embodiment of the present invention. FIG. 5 illustrates a buried channel MOS transistor 500 with a low resistance ultra shallow tip region 510. Transistor 500 can be fabricated in the same manner as transistor 340 except that semiconductor substrate 300 also includes a top deposited semiconductor material 524 with a thickness between 200 Å–1000 Å doped to an p-type conductivity with a concentration between $1\times10^{17}/cm^3$ to $1\times10^{19}/cm^3$. It is to be appreciated that the preferred dimensions of the present invention are relative to the top surface 526 of deposited semiconductor material 524 which in this embodiment is to be considered as the top surface of semiconductor substrate 300. It is to be appreciated that deposited semiconductor material 524 need not necessarily be a single homogenous semiconductor material, but may be comprised of a plurality of differently doped and different semiconductor materials. Buried channel transistor 500 exhibits increased channel carrier mobility which improves the devices' drive current and switching speed.

Figure 6:
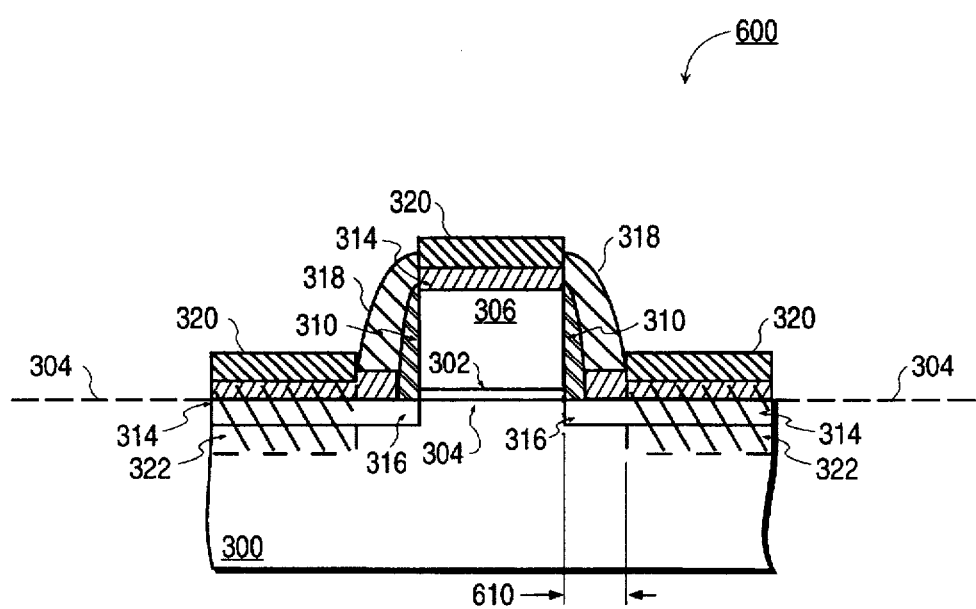
FIG. 6 is an illustration of a cross-sectional view showing another preferred embodiment of the low resistance ultra shallow tip transistor of the present invention with vertically and horizontally diffused ultra shallow tip region.

FIG. 6 is a cross-sectional view of a preferred alternative embodiment of the present invention. FIG. 6 shows an MOS transistor 600 with a low resistance ultra shallow tip region 610. Transistor 600 differs from the other disclosed embodiments of the present invention, in that recesses 312 are not formed in semiconductor substrate 300 prior to selective semiconductor material 319 deposition. Instead, semiconductor material 314 is deposited directly onto the top surface 304 of semiconductor substrate 300. All of the remaining fabrication steps, as disclosed in FIGS. 3b–3f and accompanying specification, are utilized to complete fabrication of transistor 600. It is to be appreciated that with transistor 600 no semiconductor material is recessed into substrate 300 so that the solid-state diffusion step must first drive p-type dopants down (vertically) into substrate 300 and then drive them laterally (horizontally) beneath first sidewall spacer 310 to outside edges of gate electrode 306 to form ultra shallow low resistance tip region 610 of transistor 600. Although such a diffusion process has been shown to produce high performance devices, the junction of the ultra shallow low resistance tip region 610 is not as abrupt as when dopants are diffused in a single direction from a semiconductor material partially recessed into substrate 300. Although transistor 600 does not have as an abrupt of an ultra shallow tip region as other embodiments, the removal of the recess step does decrease process complexity and costs.

Many alternative embodiments and specifics of the present invention have been described, however, one skilled in the art will appreciate that many of the features in one embodiment are equally applicable to other embodiments. Additionally, although many specific dimensions, materials, and concentrations have been described, it is to be appreciated that these specific dimensions, materials, and concentrations are not to be taken as limiting. Additionally, one skilled in the art will appreciate the ability to scale the transistor of the present invention to form both larger and smaller devices. The scope of the present invention is not intended to be limited to the detailed description of the present invention and rather is to be determined by the claims which follow.

Thus, novel transistors with low resistance ultra shallow tip regions and their methods of fabrication have been described.

We claim:

1. A method of forming a transistor comprising the steps of:
   forming a gate dielectric layer on a first surface of semiconductor substrate;
   forming a gate electrode on said gate dielectric layer;
   forming a first pair of sidewall spacers adjacent to opposite sides of said gate electrode;
   forming a pair of recesses in said semiconductor substrate beneath said first surface and in alignment with the outside edges of said first pair of sidewall spacers; and
   forming a first semiconductor material in said pair of recesses to form a pair of source/drain regions.

2. The method of claim 1 further comprising the step of:
   diffusing dopants from said first semiconductor material into said substrate beneath said first pair of said sidewall spacers.

3. The method of claim 2 further comprising the step of:
   forming a second pair of sidewall spacers on said first semiconductor material adjacent to the outside edges of said first pair of sidewall spacers.

4. The method of claim 3 further comprising the step of:
   depositing ions into said first semiconductor material and said substrate in alignment with the outside edges of said second pair of sidewall spacers.

5. The method of claim 4 wherein said ions are deposited by ion implantation.

6. The method of claim 3 further comprising the step of:
   forming silicide on said semiconductor material in alignment with the outside edges of said second pair of sidewall spacers.

7. The method of claim 3 further comprising the step of:
   forming a second semiconductor material on said first semiconductor material in alignment with the outside edges of said second pair of sidewall spacers.

8. The method of claim 7 further comprising the step of:
   forming silicide on said second semiconductor material.

9. A method of forming a transistor comprising the steps of:
   forming a gate dielectric layer on a semiconductor substrate;
   forming a gate electrode on said gate dielectric layer;
   forming a first pair of sidewall spacers adjacent to opposite sides of said gate electrode;
   forming a first doped semiconductor material on said semiconductor substrate in alignment with the outside edges of said first sidewall spacers;
   diffusing dopants from said first semiconductor material into said substrate beneath said first pair of sidewall spacers to form a pair of tip regions;
   forming a second pair of sidewall spacers on said first semiconductor material adjacent to the outside edges of said first pair of sidewall spacers; and
   implanting ions into said semiconductor material and said substrate in alignment with the outside edges of said second pair of sidewall spacers to form source/drain contact regions.

10. The method of claim 9 wherein said first pair of spacers are between 50 Å–500 Å.

11. The method of claim 9 wherein said ion implantation step dopes said gate electrode.

12. The method of claim 9 further comprising the step of:
    forming silicide on said first semiconductor material in alignment with the outside edges of said second pair of sidewall spacers.

13. The method of claim 9 further comprising the step of:
    forming a second semiconductor material on said first said semiconductor material in alignment with the outside edges of said second pair of sidewall spacers.

14. The method of claim 13 further comprising the step of:
    forming silicide on said second semiconductor material.

15. A transistor comprising:
    a gate dielectric layer formed on said first surface of a semiconductor substrate;
    a gate electrode formed on said gate dielectric layer;
    a first pair of sidewall spacers adjacent to and on opposite sides of said gate electrode;
    a first pair of ultra shallow tip regions formed in said, semiconductor substrate and extending beneath said first pair of sidewall spacers and opposite sides of said gate electrode;
    a pair of raised tip regions formed in alignment with the outside edges of said first pair of said sidewall spacers wherein said pair of raised tip regions comprise a first deposited semiconductor material with the least a portion of said semiconductor material above and below said first surface of said semiconductor substrate.

16. The transistor of claim 15 further comprising:
    a second pair of sidewall spacers formed adjacent to the outside edges of said first pair of spacers, said second pair of sidewall spacers formed on said pair of raised tip regions.

17. The transistor of claim 15 further comprising:
    a pair of source/drain contact regions formed in alignment with said second pair of sidewall spacers, said pair of source/drain contact regions formed deeper into said substrate than said pair of raised tip regions.

18. The transistor of claim 16 further comprising silicide formed on said pair of source/drain contact regions and on said gate electrode.

19. The transistor of claim 16 further comprising a second semiconductor material formed on said first deposited semiconductor material adjacent to the outside edges of said second pair of spacers.

20. The transistor of claim 19 further comprising silicide formed on said second semiconductor material.

21. The transistor of claim 15 wherein said pair of raised tip regions comprise deposited polysilicon.

22. The transistor of claim 15 wherein said pair of raised tip regions comprise deposited single crystalline silicon.

23. The transistor of claim 15 wherein said pair of raised tip regions comprise deposited silicon/germanium semiconductor.

24. The transistor of claim 15 wherein said first pair of sidewall spacers are between approximately 50 Å–500 Å thick.

25. The transistor of claim 15 wherein said second pair of sidewall spacers are between approximately 500 Å–2500 Å thick.

26. The transistor of claim 15 wherein said pair of raised tip regions extend between approximately 20 Å–1000 Å beneath said first surface of said semiconductor substrate.

27. The transistor of claim 15 wherein said pair of ultra shallow tip regions have a depth between 20 Å–100 Å beneath said first surface of said semiconductor substrate and a length of greater than 100 Å.

28. A method of forming a transistor comprising the steps of:

forming a gate dielectric layer on a first surface of a semiconductor substrate;

forming a gate electrode on said gate dielectric layer:

forming a pair of recesses in semiconductor substrate on opposite sides of said gate electrode; and forming a pair of source/drain regions through said recesses.

29. A method of forming a transistor comprising the steps of:

forming a gate electrode on a gate dielectric layer on a first surface of a semiconductor substrate;

forming a pair of sidewall spacers adjacent to opposite side of said gate electrode;

forming a pair of recesses in said semiconductor substrate in alignment with the outside edge of said first pair of sidewall spacers; and forming a pair of source/drain regions through said pair of recesses.

30. A method of forming a transistor comprising the steps of:

forming a gate electrode on a gate dielectric layer of a semiconductor substrate;

forming a pair of recesses in said semiconductor substrate on opposite sides of said gate electrode; and forming a pair of source/drain regions in said pair of recesses.

* * * * *